United States Patent

[11] 3,605,034

[72] Inventors Charles T. Rucker
Clearwater;
John W. Amoss, Jr., Dunedin, both of Fla.
[21] Appl. No. 853,725
[22] Filed Aug. 28, 1969
[45] Patented Sept. 14, 1971
[73] Assignee Sperry Rand Corporation
New York, N.Y.

[54] COAXIAL CAVITY NEGATIVE RESISTANCE AMPLIFIERS AND OSCILLATORS

21 Claims, 5 Drawing Figs.

[52] U.S. Cl. .... 331/56, 330/34, 330/56, 330/61 A, 331/96, 331/101, 331/102, 331/107 R, 331/107 G, 331/107 T, 333/81 A, 333/82 B
[51] Int. Cl. .... H03b 7/14
[50] Field of Search .... 331/56, 96, 101, 102, 107, 107 G, 107 T, 117 D; 330/34, 56, 61 A; 333/81 A, 82, 82 B

[56] References Cited

UNITED STATES PATENTS

| | | | |
|---|---|---|---|
| 2,899,646 | 8/1959 | Read, Jr. | 331/96 |
| 3,231,831 | 1/1966 | Hines | 331/96 |
| 3,252,112 | 5/1966 | Hauer | 331/107 T |
| 3,356,866 | 12/1967 | Misawa | 331/96 X |

*Primary Examiner*—Roy Lake
*Assistant Examiner*—Siegfried H. Grimm
*Attorney*—S. C. Yeaton

ABSTRACT: A semiconductor diode interiorly coupled to fields within a coaxial line cavity resonator serves as a negative resistance device, amplifying the high frequency fields present within the cavity. The combination forms a single port microwave amplifier or oscillator. A simple resistor, placed in the diode bias circuit in series with the diode, eliminates spurious modes of high frequency oscillation within the cavity.

INVENTORS
JOHN W. AMOSS JR.
CHARLES T. RUCKER
BY
H P Terry
ATTORNEY

INVENTORS
JOHN W. AMOSS JR.
CHARLES T. RUCKER
BY
H P Terry
ATTORNEY

INVENTORS
JOHN W. AMOSS JR.
CHARLES T. RUCKER
BY
H P Terry
ATTORNEY

COAXIAL CAVITY NEGATIVE RESISTANCE AMPLIFIERS AND OSCILLATORS

BACKGROUND OF THE INVENTION

1. Field of the Invention

The invention pertains to means for the generation or amplification of desired high-frequency oscillations within hollow resonators and more particularly to the efficient generation or amplification of such desired high-frequency signals without generation of spurious signals, all by the use of active semiconductor elements exhibiting negative resistance characteristics.

2, Description of the Prior Art

A problem with broadband microwave diode oscillators and amplifiers of the prior art has been that they prove difficult to construct so that a stable output having substantially constant frequency and amplitude is produced. The problem is often severe in microwave oscillators and amplifiers that employ, for example, tunnel diodes, avalanche diodes, or Gunn effect diodes as active elements. These and other such negative resistance devices generally display negative resistance characteristics over wide frequency ranges. In fact, negative resistance characteristics are found to be common in commercially available microwave diodes over ranges as great as two octaves. While the mechanisms producing such spurious operation are not fully understood, it appears that some of the low-frequency negative resistance effects occur only when the diode is operating in the environment of a microwave field. In some cases (for example, where an avalanche diode is used), it appears that there are also certain parametric effects present which extend the generation of undesired signals down to extremely low frequencies.

A further problem with the use of certain cavity resonators in such oscillators and amplifier systems is that oscillation modes having frequency harmonic relation may be excited, since such resonators display a relatively high Q over an extended frequency band. Because any undesired mode requires power to be sustained, it absorbs power which, in the absence of the mode, would go to building up the excitation of the mode of desired frequency. Further, the undesired signals appear at various and time-varying levels in the output signal. Not only is the presence in the output of such undesired signals a serious problem in itself, but undesired interactions may often be present between the desired signal and the spurious signals as well as between undesired signals.

Prior art negative resistance oscillators and amplifiers have generally been limited in application because of their relatively low output power levels. The output signal level has been determined by the internal nature of the semiconductor diode, and it is found that certain voltage and temperature levels cannot be exceeded without catastrophic damage to the diode. Efforts to operate diode oscillators and amplifiers in parallel to obtain greater power have met serious obstacles. Each diode element separately displays its own version of the idiosyncrasies mentioned above. Each has its individual resonance characteristic. When coupled into the microwave cavity circuit, a multiplicity of individual resonant circuits appears. The consequent multiple-resonant network adds to the instability of the output signal and to the multiplicity of frequencies generated. It is often desirable to be able to tune a microwave diode device over at least a moderate range of frequencies, but accurate tuning of oscillators of this type tends to compound already-formidable difficulties.

SUMMARY OF THE INVENTION

The present invention concerns an active negative resistance semiconductor diode circuit which operates efficiently as an oscillator or amplifier of microwave energy. The improved active microwave device includes a hollow cavity resonator of the coaxial line-type within which is coupled a self-resonant diode biased by an external biasing means so as to exhibit its negative resistance characteristic. The diode is located between one wall of the resonant cavity and a quarter-wave-long portion of the inner conductor of the cavity. The inner conductor is extended to a second wall of the cavity, the extension serving as a shorted, relatively high-impedance, quarter-wave biasing line portion. A positive resistance element is placed in series with the diode in such a fashion as to eliminate all spurious oscillations, whether of parametric or other origin. A useful high-frequency output is derived by a conductive, capacitive, or other coupling adjacent the juncture of the two quarter-wave line portions.

The positive resistance element functions to eliminate spurious signals because of its particular location with respect to the two quarter-wave line portions. By using a similar relative placement of several positive resistor elements in a symmetric configuration, each in association with a corresponding negative resistance diode, and each coupled in common to a shorted, high-impedance, quarter-wave biasing line portion, correspondingly higher power operation is efficiently achieved without generation of spurious signals. The outputs of as many as five diodes, for example, are readily combined, with the total output signal having excellent phase and amplitude stability.

The simple positive resistor network eliminates the prior need to use complex hybrid power-combining networks that are relatively lossy and cumbersome devices. The need for readjustment of the network if a diode requires replacement is eliminated. The positive resistive network not only prevents unstable operation but also enables equal power sharing of each diode by the load and provides a means of phase-locking of the oscillations of the individual diode sources.

A striking feature of the invention lies in the fact that the positive resistors employed can be simple, inexpensive carbon resistors, such as those commercially available to use in ordinary low-frequency circuits. The cavity resonator is a simple, rugged structure, and since the resistors are doubly shielded within it from damage, the complete device is relatively easy to manufacture and is immune to the effects of shock and vibration.

The above result is in contrast to the practice in the prior art wherein relatively delicate microwave resistance films are plated or otherwise applied on portions of the resonator cavity walls, one or more coupling orifices are oriented to couple undesired mode energy out of the resonant cavity, or specially shaped and complex-to-build cavity resonators are constructed, some having within their interiors complex vanes or other such elements to discriminate against undesired oscillation modes. In particular, the invention avoids the need for complex dissipative circuit elements inside of or outside of the resonant cavity, complex electrically insulated cavity wall portions, microwave chokes in association with such isolated cavity portions, and prior art configurations that are difficult to manufacture and to maintain, cumbersome, expensive, and heavy.

While applicable to use in high-frequency amplifiers and oscillators designed to operate over selected parts of a wide range of high frequencies, the invention is particularly advantageous for use in the high-frequency microwave ranges, including the so-called X-band and other higher frequency bands. In such frequency regimes the sizes of resonant cavities are so small that the elements associated with them become very small. The essential elements become fragile and difficult to assemble. Provision of means present in the prior art for suppressing undesired oscillation modes and other noise energy becomes increasingly difficult.

DESCRIPTION OF THE INVENTION

Figure 1:
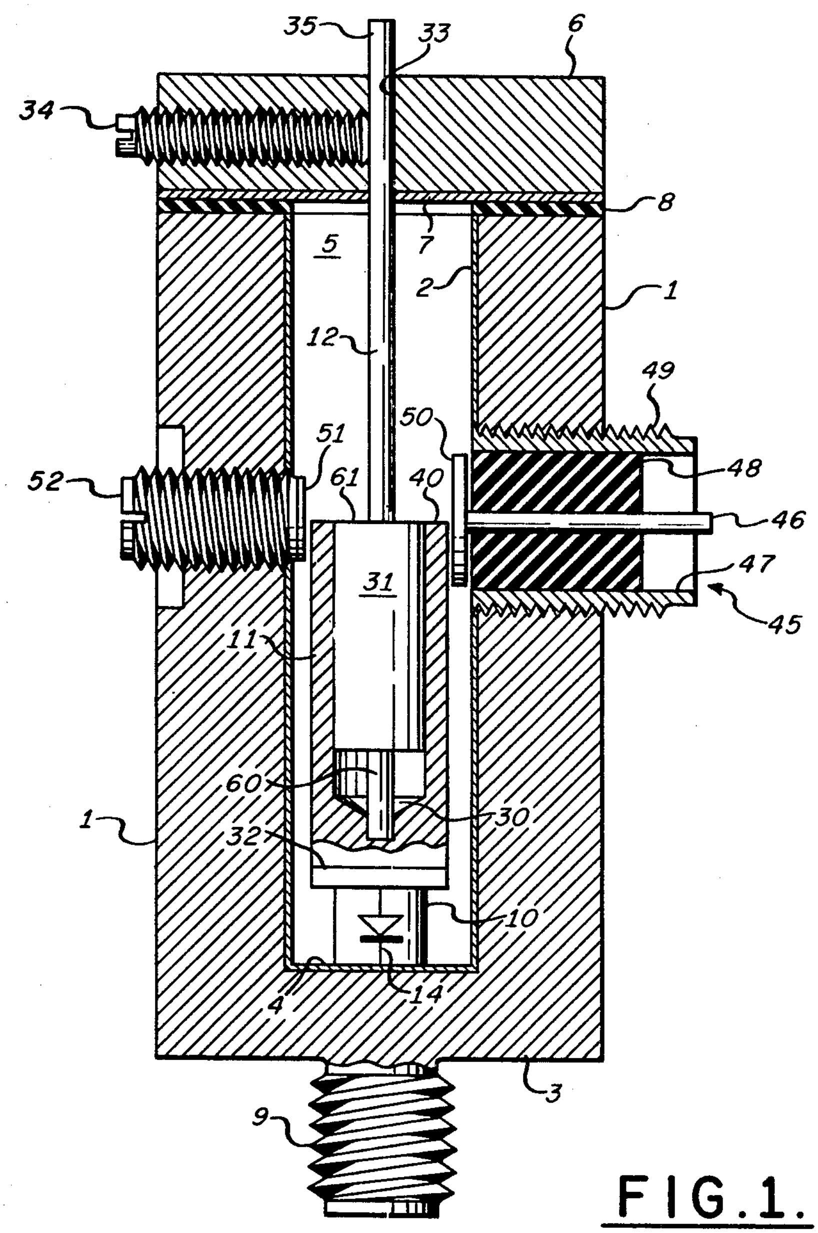
FIG. 1 is a cross-sectional view of a preferred embodiment of the present invention.

Referring to FIG. 1, an embodiment of the invention in the form of a hollow cavity resonator semiconductor diode oscillator or amplifier is shown embodying the inventive means for suppressing modes of oscillation generation other than that associated with the desired output frequency. In the figure, the cavity resonator 5 is bounded by a cylindrical tubular wall 1 having a circularly cylindric interior surface or coating 2 presenting good electrical conductivity characteristics at the operating high frequency. One end of the cavity 5 is closed by a flat wall 3; wall 3 is formed integrally with wall 1 and has adjacent the interior of the cavity 5 bounded in part by it a surface 4 also of good high-frequency electrical conductivity. Opposite wall 3, cavity 5 is further defined by a flat wall or disk 6, whose interior surface 7 also has good electrical conductivity especially wherever adjacent cavity 5. Wall or plate 6 is not formed integrally with cylindrical wall 1, but is a physically discrete part. For reasons which will become apparent, end wall or plate 6 is insulated electrically from wall 1. Provision of the electrical insulation is afforded by an annular flat washer or ring 8 of mica or other suitable dielectric material dielectric material. Ring 8, as will become apparent, provides high-frequency capacitive coupling between conducting surface 2 and 7.

Stud 9 on the exterior of wall 3 is provided with threads so that the resonant cavity may be firmly attached to a suitable base plate or chassis element. Not only does stud 9 provide means for mounting the described elements, but also serves to prevent undue rise of temperature thereof caused by internal ohmic losses.

Surface 4 of wall 3 of cavity resonator 5 is connected to the opposed surface 7 of wall 6 by further elements of the invention, including active semiconductor or diode element 10, a first quarter-wave length line portion 11, and a second quarter-wave length line portion 12. It is understood that portions 11 and 12 are one quarter-wave length in dimension where the wavelength being referred to is associated with the desired operation frequency of the device, whether functioning as an oscillator or as an amplifier. Quarter-wave length line portions 11 and 12 are generally of different characteristic impedances, and therefore may differ in diameter. The cylindrical surfaces of lines 11 and 12 have low ohmic loss characteristics at the operating high frequency similar to those of wall surfaces 2, 4, and 7.

Semiconductor diode 10 is a commercially available microwave diode, for example, of the avalanche transit time-type, although microwave diodes operating according to other energy converting mechanisms may be substituted. Diode 10 is shown in FIG. 1 in full view and, for ease in understanding its relation to its associated elements, a schematic indication 14 of its polarization is illustrated as if it were actually on the cylindrical outer surface of diode 10. Diode 10 is bonded to conducting surface 4 by any suitable known method and is similarly bonded to the flat end 32 of quarter-wave line portion 11.

Coaxial center quarter-wave line portion 11 is physically coupled at its end opposite diode 10 to a second quarter-wave line portion 12. Line 12 passes through a central hole 33 in wall 6, where it is fixed in position by any convenient means, such as by setscrew 34. Quarter-wave line portion 12 acts as a shorted high-impedance, quarter-wave bias line. A bias voltage supply (not shown) coupled between terminal 35 of line 12 and any point in the figure below the level of insulating washer 8 provides an energizing bias voltage across microwave diode 10.

For the purpose of abstracting high-frequency energy from cavity 5, an output transmission line 45 is provided. Line 45 may be, for example, a coaxial transmission line, having the usual inner conductor 46 and a tubular outer conductor 47. As is normal practice, inner conductor 46 is conveniently supported in concentric relation to outer conductor 47 by an apertured bead 48 of dielectric material having very low electrical loss characteristics at the operating frequency. The outer surface of outer conductor 47 is provided with threads whereby it is fastened within a threaded hole passing through wall 1; also, threads 49 provide a convenient means for coupling an external transmission line (not shown) between the oscillator output and utilization apparatus.

Outer conductor 47 and bead 48 may end at surface 2 of wall 1 with a flat surface or a rounded end surface conforming to the shape of cylindrical surface 2. However, inner conductor 46 extends slightly into cavity 5 for the purpose of supporting a round capacitive coupling disk or plate 50 within cavity 5 adjacent the junction between line portions 11 and 12. Inner conductor 46 is centered substantially in the plane defined by the end 40 of line portion 11, though slightly different geometrical relationships can be successfully employed. Alternatively, known coupling means for extracting energy from the oscillating hgih-frequency field in cavity 5 may be employed. The capacitive coupling arrangement effectively couples to the desired oscillating high-frequency electric fields in the vicinity of the junction between line portions 11 and 12. Further, a capacitive tuner element 52 is directly opposite disk or plate 50 and also centered substantially in the plane of face 40.

Tuner element 52 is a simple screw made preferably of the same good electrically conducting material as surfaces 2 and 4, for example. As noted, it is mounted in a threaded hole in wall 1 with its central axis substantially in the plane of face 40. Its inner face is thus adjacent the junction between line portions 11 and 12, where it interacts in substantially a conventional manner with the oscillating electric fields in the vicinity of that junction to provide the desired tuning effect. Frequency adjustment is accomplished by simple rotation of screw 52 which translates face 51 relative to wall 2 and to line portion 11.

Figure 1A:
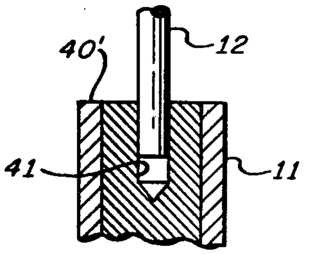
FIG 1*a* is a simplified cross-sectional view of a portion of FIG. 1.

For ease of explanation, the series elements 10, 11, and 12 will next be considered as if quarter-wave line portion 11 were in fact made up of only solid electrically conductive material, quarter-wave line portion 12 being physically attached directly to an upper metallic face of quarter-wave line portion 11, the bore 30 accommodating resistor element 31 being absent. FIG. 1*a* is offered to illustrate such a hypothetical construction; it is seen that quarter-wave line portion 12 is shown as conductively attached directly within a center bore 41 in the upper conducting metallic face 40′ of quarter-wave line portion 11. From such a hypothetical model, a qualitative theory of explanation of the operation of the structure thus far described can be presented. It is to be understood that the explanation is purely qualitative and that it is offered merely as an aid to the better understanding of the invention.

It has been experimentally observed that at least certain semiconductor diodes operating in the microwave regime can be represented, for example in the large signal case, by an equivalent circuit. For instance, recent experimental studies over a frequency range of 5.0 to 20.0 GHz. have shown that, under large signal conditions, such diode junctions may be represented as consisting, as in FIG. 2, of a low positive resistance $R_u$ in series with a capacitance $C_A$ about 1.5 times as large as the diode junction capacitance at breakdown, and with a source of voltage V corresponding to the negative impedance characteristic of the diode.

Figure 2:
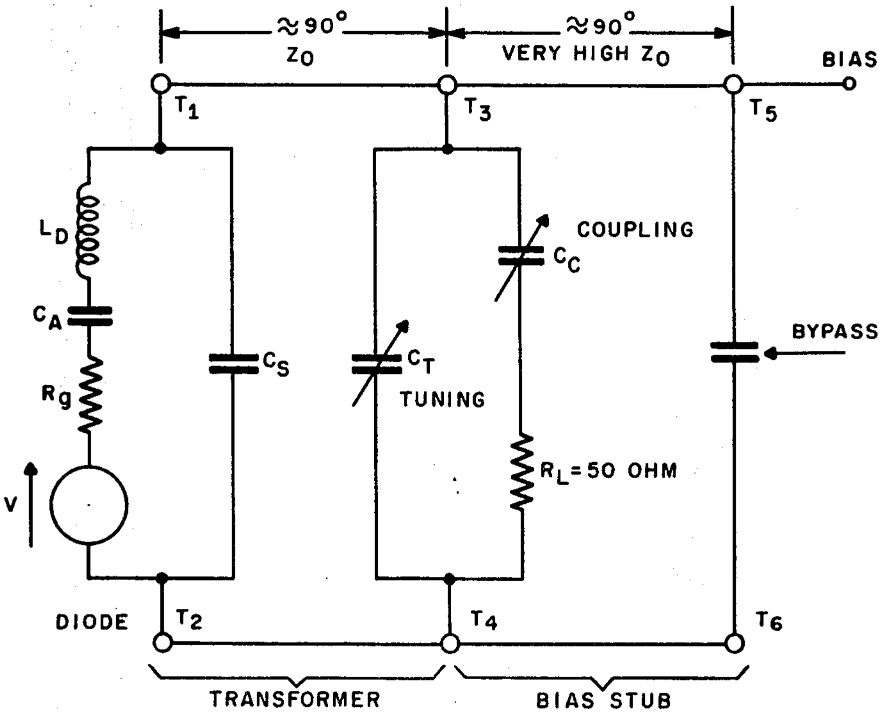
FIG. 2 is a schematic circuit representing a lumped-constant equivalent circuit.

Referring to FIG. 2, the equivalent circuit of the diode 10 of FIG. 1 is shown as including equivalent circuit elements $C_A$, $R_u$, and V. The value of $R_u$ is found experimentally to be of the order of 1 ohm, for example. Mounting and/or encapsulation elements associated with conventional microwave diodes unavoidably introduce certain reactive elements, such as a series factor $L_D$ accounting for the lead inductance of the diode. The diode package also presents a shunt capacitive effect, requiring the addition of capacitor $C_s$ to the model circuit of FIG. 2.

The mode of diode oscillation of greatest significance is the series resonance mode wherein the diode capacitance $C_A$ and the lead inductance $L_D$ are resonant. In the invention of FIG. 1, the reactance of the diode package shunt capacitance $C_s$ is selected to be large compared to the positive resistance $R_g$ so that the effect of $C_s$ may be ignored.

A suitable load cannot be placed in FIG. 2 directly across the terminals $T_1$, $T_2$ of diode 10. FOr example, it would be expected normally to use a load resistance $R_L$ on the order of 50 ohms, while $R_g$ for available diodes is on the order of 1 to 3 ohms. The invention therefore employs impedance transformation means between the diode circuit and the output. The load $R_L$ is placed at a distance substantially 90° along the equivalent transmission line, as shown in FIG. 2. FIG. 2 shows the placement of the load $R_L$ at a position about 90° along the line from the diode, also with inclusion of a capacity $C_c$ representing the output coupling capacity in series with $R_L$ and a capacity $C_T$ in shunt with $R_L$ to represent the capacitive effect of the tuner element at the junction of lines 11 and 12 in FIGS. 1 and 1*a*. Capacitance $C_T$ is similarly located.

FIG. 2 also qualitatively represents the placement of the bypass condenser at terminals $T_5$, $T_6$ substantially 90° further down the line with respect to the load $R_L$ terminals $T_3$, $T_4$. The shorted, high-impedance quarter-wave stub line permits, as in FIG. 1, the application of a proper unidirectional bias voltage so that it may be injected across diode 10.

Referring again to FIGS. 1 and 1*a*, the correspondence of the elements of the physical structure shown therein to the model circuit of FIG. 2 is clearly apparent. The parameters V, $R_g$, $C_A$, $L_D$, and $C_s$ are clearly associated with diode 10. Diode 10 is bonded at face 30 to a quarter-wave transmission line of relatively low characteristic impedance serving as an impedance transforming means between diode 10 nd the system load $R_1$ effectively located at the face 40 of line portion 11. The output coupling disk 50 and line 46, 47 and the capacitive tuner face 51 are also respectively effective in the plane of the face 40 formed at the junction between line portions 11 and 12. The very high-impedance quarter-wave line coupling terminals $T_3$, $T_4$ to terminals $T_5$, $T_6$ in FIG. 2 represents the bias stub line portions 12 across which is placed the bypass condenser formed about mica washer 8.

In the foregoing, the invention has been spoken of as suitable for use as an oscillator or as an amplifier. In fact, the single port configuration of FIGS. 1 and 1*a* is suitable for either function with minor adjustment. When the device is employed as an oscillator, the capacitive output coupling disk or plate 50 is located relatively farther from the junction between line portions 11 and 12 so that the loading on diode 10 is small, allowing a net negative resistance. For operation as an amplifier, the capacitive disk is located closer to the junction of line portions 11 and 12. Then, the loading on diode 10 is larger, resulting in a net positive resistance and, further resulting in the cessation of oscillations. In this circumstance, the device of FIG. 1 acts as a single port amplifier device. Operation as a single port amplifier may also be achieved by a slight enlargement of the dimensions of the face of capacitive coupling disk or plate 50. In operation as an amplifier, a conventional ferrite microwave circulator (not shown) may be employed to separate the input and output signals of the amplifier in the conventional manner.

While the arrangement suggested in FIG. 1*a* may prove satisfactory in certain situations, its degree of proper operation depends upon subtle and difficult-to-predict properties of the microwave diode employed. Spurious signals at various frequencies can be generated through various mechanisms. The wide frequency range in which negative resistance characteristics are present in known microwave diodes yields unstable and unpredictable operation, as do parametric and other effects. The role of the resistor element 31 placed within the bore 30 of quarter-wave line portion 11 in FIG. 1 is to eliminate the undesired results of such disturbing influences.

Referring to FIG. 1, there is disclosed a resistor element with first and second leads 12 and 60 fitted within a central bore 30 in line 11. Lead 60 is soldered within a small hole drilled into the end of bore 30 before diode 10 is sealed to line 11. The second lead 12 may be, in fact, used as the high-impedance quarter-wave line portion 12, its outer end being held within bore 33 in disk 6 by screw 34. As illustrated, one face or end 61 of the resistor 31 lies substantially in the plane of face 40.

Resistor 31 is a standard carbon resistor of the type commonly employed in relatively low-frequency lumped-constant circuits. It is not necessary to modify the resistor element in any way; it is simply employed directly as supplied by the manufacturer. The only change may be to copperplate or otherwise coat the lead-forming quarter-wave line portion 12 with a good electrical conductor, if necessary. The resistor 31 may nominally have a ⅛ or ¼-watt dissipation characteristic. Its resistance value is experimentally determined according to the particular operating frequency and diode 10 employed. For example, a way of deciding on the minimum acceptable resistance value for use with a particular diode type is to start by using a resistor 31 having a small resistance value, such as 5 ohms, and to increase that value until it is observed that parametrically generated noise or other spurious microwave signals cease in the output of the device, only the clean desired signal being generated. A safe minimum resistance value is selected to avoid excessive internal heating of the structure since bias current for diode 10 must flow through resistor 31. By way of example, C-band oscillators employing the invention generally use relatively low resistance values of the order of 10 ohms, while certain X-band oscillators are found to require resistors of 50 ohms or higher.

In one experimental example of an instrument like that of FIG. 1 built for operation at 9.0 GHz, the value of the quarter-wave dimension is 0.328 inches and the diode itself is about 0.060 inches in height. The inner diameter of surface 2 is 0.204 inches. The actual dimensions of the ⅛-watt resistor 31 employed were 0.063 inches in diameter and 0.130 inches in length. Consideration of the small interior dimensions of the device readily substantiates the experimental finding that construction of a diode oscillator according to the invention is uncomplicated as compared to prior art devices.

Experimental evidence suggests that the operation of resistor 31 in removing undesired signals from the oscillator output is to absorb noise energy in undesired modes to the extent that such oscillations are substantially never sustained. At the desired operating frequency, no high-frequency currents flow from line 11 to line 12 across the junction therebetween. Thus, the exposed surface 61 carries no high-frequency current corresponding to the desired frequency. Experiencing no losses, the desired frequency signal strength grows, being efficiently amplified by the amplification mechanism of diode 10.

Signals having undesired space or frequency modes of oscillation cannot build up in amplitude, since each such mode would cause currents to flow along face 61 of resistor 31. Such modes would cause currents to penetrate into face 61 to the usual skin depth, whereby the undesired energy would be converted into heat. The important result is that the simple resistor 31 can be involved within a microwave cavity resonator circuit in such a way as to suppress undesired signals without having any substantial effect on the efficient production of stable desired oscillations. A further significant feature lies in the fact that the subject undesired mode suppressing means can be incorporated directly within a portion of the microwave circuit in such a manner as to be effectively compatible therewith; i.e., the novel microwave circuit has natural geometrical and other characteristics permitting the direct incorporation of a simple resistor for suppressing undesired modes and preventing unstable and inefficient operation.

Figure 3:
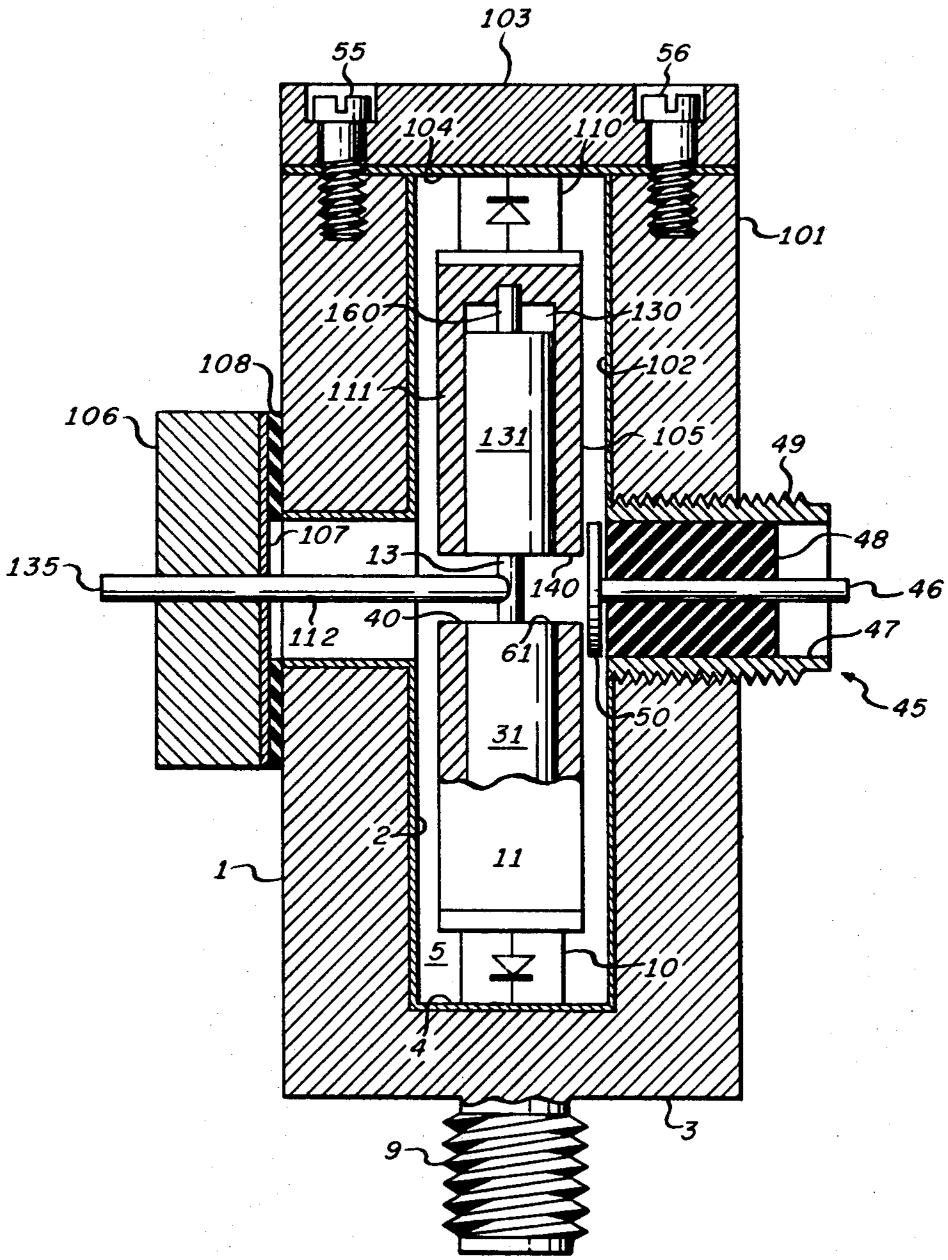
FIG. 3 is a view similar to FIG. 1 partially in cross section illustrating another embodiment of the invention.

A symmetric form of the apparatus using two diodes and therefore capable of producing a higher energy level at its output is shown in FIG. 3. In this structure, a mirror image configuration is employed. Elements in the lower half of FIG. 3 which correspond in character and operation to the elements in the lower half of FIG. 1 have the same reference numerals, including wall 1, surface 2, wall 3, surface 4, cavity 5, mounting stud 9, diode 10, quarter-wave line portion 11, and resistor 31.

Elements in the upper half of FIG. 3 which correspond in character and function to elements in the lower half of FIG. 3 also have corresponding reference numerals, each raised in value by one hundred. These corresponding elements include wall 101 (an integral extension of wall 1), surface 102 (an integral extension of surface 2), cavity 105, quarter-wave line portion 111, and resistor 131. For purposes of clarity, quarter-wave line portion 111 has been shown in section. To facilitate assembly of the structure, end wall 103 is a disk separable from wall 101, being normally fixed thereto in direct conductive relation by screws 55, 56.

In FIG. 3, the leads of resistors 31, 131 are joined directly in any suitable manner to form a short connection 13 between resistors 31, 131. Furthermore, connection 13 serves as a junction with quarter-wave length, high-impedance line portion 112, now extending at right angles to the axis of line portions 11, 111. Quarter-wave line portion 112 is fixed centrally within disk 106 and extends therethrough to form terminal 135, corresponding to terminal 35 of FIG. 1. Disk or plate 106 is sealed to an annular dielectric ring 108, sealed in turn by any suitable sealant or nonconductive fastener to the flat outer surface of wall 1, 101. Quarter-wave stub line 112 thus serves to admit biasing current to diodes 10, 110 without disturbing the high-frequency operation of the apparatus.

As in FIG. 1, the apparatus of FIG. 3 employs a capacitive output disk or plate 50 for coupling output energy to utilization apparatus via coaxial transmission line 45. Since the elements of line 45 in FIGS. 1 and 3 are the same, they bear similar reference numerals and require no further discussion.

The mechanical and consequential electrical symmetry of the structure of FIG. 3 affords stable operation. Any unbalance of potentials due, for instance, to somewhat varying diode characteristics, tends to cause currents to flow in resistors 31, 131, which tendency forces the oscillators associated individually with diodes 10, 110 to shift phase and to return to an accurately phase-locked condition. This property of the circuits further advantageous, as careful matching of the diodes 10, 110 is not a strict requirement as in prior art paralleled diode-oscillator circuits. Tuner means similar to tuner 51, 52 of FIG. 1 may be employed, though not shown for the sake of achieving pair of diodes 10 and 110 is used with good effect. The invention is, indeed, not limited to use with only a pair of diodes, as a plurality of diodes may be employed in a configuration which may be visualized as formed by generating a figure of revolution of the lower half of FIG. 3 about conductor 46, except that the plurality of diodes and associated quarter-wave lines form radial elements generally like the radiating spokes of a wheel. It is to be noted that in the single diode device of FIG. 1, in the dual diode device of FIG. 3, and in other plural diode devices according to the invention, each resistor 31 is inserted in a coaxial quarter-wave center conductor and is attached to a shorted, high-impedance, quarter-wave bias line. Negligible current flows in each resistor 31 at the desired output frequency, thus substantially no insertion loss is presented. At frequencies other than the desired operating frequency, however, significant currents flow in each resistor 31, and energy does not build up in corresponding undesired oscillation modes.

Figure 4:
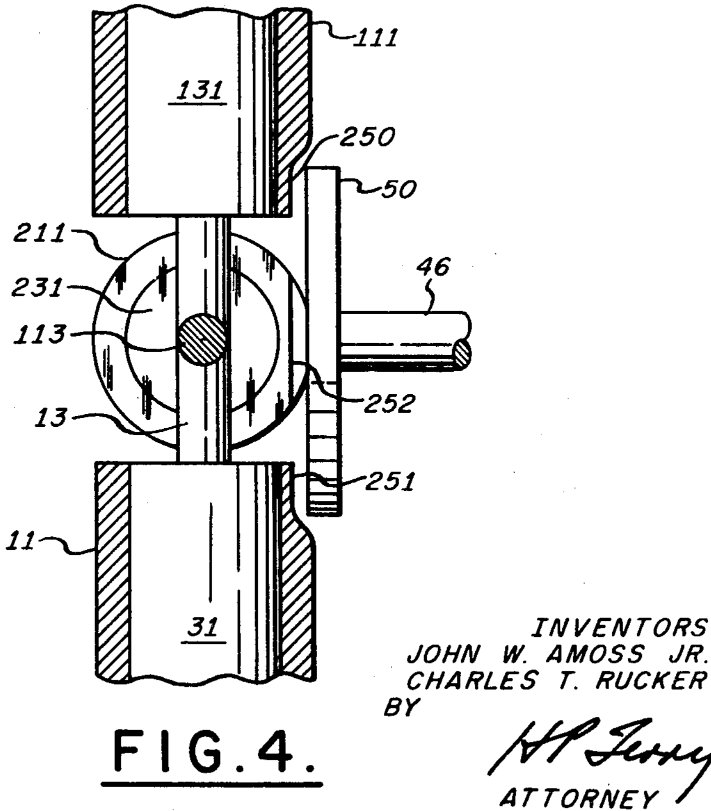
FIG. 4 is a view partially in cross section of a detail of a further embodiment of the invention similar to that of FIG. 3.

FIG. 4 shows a detail of a structure using, for example, four diodes with four associated radiating arms. As in FIG. 3, the ends of opposed quarter-wave line portions 11, 111 are shown. Line portions 11, 111 again respectively encompass resistors 31, 131. Resistors 31, 131 are again joined by lead 13. A face view of a third quarter-wave line portion 211 is shown, along with its encompassed resistor 231. Above the plane of the drawing, lead 113 connects to a fourth quarter-wave line and resistor (neither is shown in the drawing). The respective quarter-wave lines are shown cut away at 250, 251, and 252 so as to accommodate close positioning of capacitive output coupling disk 50 with respect to leads 13, 113.

An important additional role of capacitive output coupling disk or plate 50 in multiple diode forms of the invention lies in its provision of means for forcing phase-locking of the individual diodes of the plural diode generator. The capacitive disk 50 provides important cross coupling between the individual diode oscillators, in addition to coupling the combined output, so that the load tends equally to share all oscillators.

In an experimental version of the invention employing five diodes and five associated arms, an improvement of about 9 db. was found in signal-to-amplitude-modulated-noise ratio. This important result comes about because the desired signals are phase-locked, while noise components are not. A further unexpected result in multiple diode forms of the invention is that the diodes operate at higher current levels than would be expected on the basis of knowledge of the usual behavior of a single diode. Thus, each diode in a multiple diode system according to the invention can be operated at higher input power levels than would be permissible in a single diode oscillator using the same diode.

While the invention has been described in it s preferred embodiments, it is to be understood that the words which have been used are words of description rather than of limitation and that changes within the purview of the appended claims may be made without departure from the true scope and spirit of the invention in its broader aspects.

We claim:

1. In a high-frequency energy device,
semiconductor means,
resonant circuit means coupled to said semiconductor means,
said resonant circuit means including biasing means connected across said semiconductor means for biasing said latter means to its negative resistance state,
said biasing means including first and second quarter-wave line portions of different characteristic impedances,
high-frequency coupling means adjacent the junction of said first and second quarter-wave line portions adapted for interchange of high-frequency energy with at least one utilization device.

2. A high-frequency energy device according to claim 1 wherein said resonant circuit means is a coaxial line cavity resonator.

3. A high-frequency energy device according to claim 1, wherein capacitive tuning means is disposed adjacent the junction of said first and second quarter-wave line portions opposite said high-frequency coupling means.

4. A microwave signal amplifying device comprising semiconductor means,
resonant circuit means connected across said semiconductor means,
said resonant circuit means including means across said semiconductor means for biasing said latter means to its negative resistance state,
said biasing means including a first quarter-wave transmission line portion joined to a resistive means,
said resistive means being surrounded in part by a second quarter-wave transmission line portion,
said resistive means being connected to said second quarter-wave transmission line element adjacent said semiconductor element,
means for abstracting energy from said signal amplifying device.

5. In a high-frequency energy device,
a hollow body defining a cavity with interior walls of high electrical conductivity,
said cavity having a first end wall integrally formed in said body,
said cavity having a second end wall insulated from said body by a dielectric member for forming a bypass condenser for high frequency energy within said cavity,
a series circuit conductively coupling said first wall to said second wall,
said series circuit comprising semiconductor means,
a first quarter-wave transmission line portion having a predetermined characteristic impedance, a second quarter-wave transmission line portion having a characteristic impedance large compared to that of said first quarter-wave transmission line portion,
means for transferring high-frequency energy with respect to said cavity.

6. An oscillator for generating high-frequency energy comprising semiconductor means,
means coupled across said semiconductor means for biasing said latter means to its negative resistance state,
resonant circuit means connected across said semiconductor means,
said biasing means including first and second quarter-wave transmission line portions,
said first quarter-wave transmission line portion being joined at one of its ends to resistive means encompassed in part by said second quarter-wave transmission line portion,
said resistive means being connected to the body of said second quarter-wave transmission line adjacent said semiconductor means,
means for abstracting high-frequency energy from said oscillator.

7. Apparatus defined in claim 6 wherein said means for abstracting high-frequency energy from said oscillator comprises capacitive coupling plate means coupled to the electric field in the vicinity of the adjacent ends of said first and second quarter-wave transmission line portions.

8. In a high-frequency device,
cavity resonator means,
said cavity resonator means including at least one high-frequency current-conducting wall,
said wall being coupled to at least one series circuit,
said series circuit comprising semiconductor means with first and second terminals respectively attached at said first terminal to said wall and at said second terminal to a quarter-wave transmission line portion of predetermined characteristic impedance,
a second quarter-wave transmission line portion having first and second terminals and having a characteristic impedance substantially greater than said predetermined characteristic impedance,
said second quarter-wave transmission line portion being coupled at a first terminal to at least one of said series circuits,
plate means capacity-coupled to said cavity resonator for forming a bypass condenser for high-frequency currents,
said second terminal of said second quarter-wave transmission line portion being conductively attached to said plate means,
means for transferring high-frequency energy with respect to said cavity.

9. In a high-frequency device according to claim 8, the structure in which said quarter-wave transmission line portion of predetermined characteristic impedance is oriented substantially at right angles to said second quarter-wave transmission line portion.

10. In a resonator device,
a cavity defining means having walls adapted for conducting high-frequency currents,
at least a portion of one of said conducting walls being capacity coupled to said currents,
series circuit means connected between said walls and said wall portion, said series circuit means including
semiconductor means having a negative resistance characteristic, and at least first and second quarter-wave transmission line portions having substantially different characteristic impedances with respect to each other, and having high conductivity for high-frequency currents, and
high-frequency means coupled to said cavity for transferring energy.

11. In apparatus of the kind described in claim 10 wherein
said first quarter-wave transmission line portion has a predetermined diameter,
said second quarter-wave transmission line portion has a larger diameter than said predetermined diameter,
said first quarter-wave transmission line portion is electrically connected to a portion of a first end of said second quarter-wave transmission line portion, a second portion of said first end being formed of material for converting unwanted high-frequency energy into heat.

12. Apparatus of the type set forth in claim 11, wherein the depth of material for converting unwanted high-frequency energy into heat is substantially greater than the skin depth for the frequency of any undesired signal present.

13. In apparatus of the kind described in claim 10, wherein
said first quarter-wave transmission line portion has a predetermined characteristic impedance,
said first quarter-wave transmission line portion has at least one end face,
said face has a substantially concentric bore therewithin,
said bore encompasses a cylindrical resistor with first and second terminal leads and first and second faces,
said first terminal lead is soldered within said bore to said first quarter-wave transmission line portion,
said first face of said resistor lies within said bore,
said second face of said resistor lies in substantially the same plane as said end face of said first quarter-wave transmission line portion,
said second terminal lead forms said second quarter-wave transmission line having a characteristic impedance differing from that of said predetermined characteristic impedance.

14. A high-frequency device according to claim 10, wherein said means for transferring high-frequency energy with respect to said cavity comprises
a transmission line passing through a wall of said cavity,
said transmission line includes inner and outer high-frequency conductors supported in coaxial relation and
said inner conductor supports capacitive coupling plate means adjacent the junction common to said first and second quarter-wave transmission line portions.

15. A device of the kind described in claim 14, wherein
the effective capacitive coupling between said capacitive coupling plate means and said junction between said first and second quarter-wave transmission line portions is adjusted below a predetermined value so that the effective loading on said semiconductor element is represented by a positive resistance smaller than the net negative resistance of said semiconductor element permitting the generation of high-frequency oscillations within said cavity.

16. A device of the kind described in claim 14 wherein
the effective capacitive coupling between said capacitive coupling plate means and said junction between said first and second quarter-wave transmission line portions is adjusted above a predetermined value so that the effective loading on said semiconductor element is represented by an equivalent positive resistance larger than the net negative resistance of said semiconductor element such that high-frequency signals coupled into said cavity from the exterior are amplified.

17. A high-frequency device having a hollow body
said body having at least first and second internal walls,
said walls being adapted to conduct high-frequency currents,
said first wall being capacitively coupled at least to said second wall,
a quarter-wave transmission line portion of a first characteristic impedance having first and second ends, coupled at its first end to said first wall, at least one quarter-wave transmission line portion of a second characteristic impedance having first and second ends and coupled at its first end to said second end of said first quarter-wave transmission line, said quarter-wave transmission line portion of second characteristic impedance being coupled at its said second end to a semiconductor element, said semiconductor element being supported by said second wall, means for abstracting high-frequency energy from said hollow body.

18. A high-frequency device having a hollow body said body having at least first and second internal walls, said walls being adapted to permit conduction of high-frequency currents, said first wall being capacitively coupled at least to said second wall, a quarter-wave transmission line portion of a first characteristic impedance and having first and second ends coupled at its first end to said first wall, an array of series circuits coupled in parallel to said second end of said transmission line portion of first characteristic impedance, said series circuits each comprising a second quarter-wave transmission line portion and a semiconductor element, said semiconductor elements being conductively mounted on said second wall, means for abstracting energy from within said hollow body.

19. Apparatus as in claim 18, wherein said series circuits form substantially symmetrical radial arms lying in a common plane substantially at right angles to said transmission line portion of first characteristic impedance.

20. Apparatus as in claim 18, wherein said second wall is cylindrical in shape.

21. Apparatus as in claim 19, wherein said means for abstracting high-frequency energy comprises capacitive coupling means symmetrically placed adjacent the said common plane of radial arms.